United States Patent [19]

Schlosser et al.

[11] Patent Number: 4,956,262

[45] Date of Patent: Sep. 11, 1990

[54] PHOTOSENSITIVE PRINTING PLATE FOR WATERLESS OFFSET PRINTING WITH PHOTOSENSITIVE LAYER OF DIAZONIUM SALT POLYCONDENSATION PRODUCT AND PHOTOPOLYMERIZABLE COMPOSITION AND OVERLYING SILICONE RUBBER LAYER

[75] Inventors: Hans-Joachim Schlosser; Joachim Gersdorf, both of Wiesbaden, Fed. Rep. of Germany

[73] Assignee: Hoechst Aktiengesellschaft, Frankfurt am Main, Fed. Rep. of Germany

[21] Appl. No.: 270,343

[22] Filed: Nov. 14, 1988

[30] Foreign Application Priority Data

Nov. 16, 1987 [DE] Fed. Rep. of Germany ....... 3738863

[51] Int. Cl.$^5$ .................. G03F 7/021; G03F 7/028; G03F 7/032; G03C 1/76
[52] U.S. Cl. .................................. 430/162; 430/175; 430/281; 430/285; 430/303
[58] Field of Search ............... 430/303, 175, 162, 281, 430/285

[56] References Cited

U.S. PATENT DOCUMENTS

| | | | |
|---|---|---|---|
| 3,511,178 | 5/1970 | Curtin | 430/303 |
| 3,894,873 | 7/1975 | Kobayashi et al. | 96/33 |
| 4,659,645 | 4/1987 | Frommeld et al. | 430/175 |
| 4,687,727 | 8/1987 | Toyoma et al. | 430/175 |
| 4,775,607 | 10/1988 | Schlosser | 430/303 |

FOREIGN PATENT DOCUMENTS 2044788 10/1980 United Kingdom .

Primary Examiner—Charles L. Bowers, Jr.
Attorney, Agent, or Firm—Foley & Lardner, Schwartz, Jeffery, Schwaab, Mack, Blumenthal & Evans

[57] ABSTRACT

A photosensitive printing plate for waterless offset printing is described which comprises a support, a photosensitive layer and an overlying, printing ink-repellent silicone rubber layer. The photosensitive layer contains a diazonium salt polycondensation product, a compound which can be polymerized by means of free radicals, preferably a (meth)acrylate, a photopolymerization initiator and optionally a binder. The printing plate has higher photosensitivity than corresponding plates whose photosensitive layer contains only a photopolymerizable mixture or only a diazonium salt polycondensation product.

16 Claims, No Drawings

PHOTOSENSITIVE PRINTING PLATE FOR WATERLESS OFFSET PRINTING WITH PHOTOSENSITIVE LAYER OF DIAZONIUM SALT POLYCONDENSATION PRODUCT AND PHOTOPOLYMERIZABLE COMPOSITION AND OVERLYING SILICONE RUBBER LAYER

BACKGROUND OF THE INVENTION

The present invention relates to a photosensitive printing plate, suitable for waterless offset printing, which comprises a support, a negative photosensitive layer, and an overlying, printing-ink repellent silicone rubber layer.

Photosensitive printing plates of the type mentioned which contain, as photosensitive compounds, polycondensation products of aromatic diazonium compounds are known from EP-A No. 0,226,201. The photosensitive layer becomes insoluble on exposure and can be developed using organic solvent mixtures. During development, the areas of the silicone rubber layer which are above the soluble, uncured areas of the photosensitive layer are removed together with these soluble areas, although they are themselves not soluble in the developer. However, it is necessary that the developer contains an adequate amount of organic solvents which swell, and thereby soften, the silicone rubber layer.

In U.S. Pat. No. 3,894,873, printing plates are described for waterless offset printing which have a photosensitive layer made from a photopolymerizable mixture. On exposure, the layer polymerizes and crosslinks with the overlying silicone rubber layer. After exposure, the plate is treated with a liquid which swells the silicone rubber. The silicone rubber swells at the unexposed points and can be removed by abrasion, but adheres firmly at the exposed points. Since the photopolymerizable layer is sensitive to atmospheric oxygen and since the silicone rubber layer is extremely oxygen-permeable, an oxygen-impermeable covering film is generally necessary; this is laminated onto the silicone layer and removed after exposure. Together with the silicone layer, this film increases the distance of the photosensitive layer from the image layer of the original and thus reduces the resolution.

Printing plates having photopolymerizable layers of the above-described type are extremely photosensitive as such. However, in the embodiment intended for waterless offset printing, relatively long exposure is necessary, obviously in order to achieve adequate bonding of the printing ink-repellent silicone layer to the photopolymerizable layer. An increase in the photosensitivity of such plates would therefore be desirable.

Printing plates for offset printing by means of fountain solutions are furthermore known which have photosensitive layers made from a diazonium salt polycondensation product, a compound which can be polymerized by means of free radicals, a photopolymerization initiator and at least one binder. Such plates are described in GB-A No. 2,044,788. The better resolution of the copy compared with pure photopolymerizable layers and the increased length of print runs compared with layers which contain only diazonium compounds as photosensitive substances are given here as advantages. In certain cases, it is also possible to carry out development using aqueous solutions or even using pure water.

In EP-A No. 0,167,963, a similar printing plate is described which contains a diazonium salt polycondensation product containing, in addition to diazonium salt units, compounds which are free of diazonium groups and are capable of condensation with formaldehyde.

The last-mentioned printing plates are not intended, and nor are they suitable, for waterless offset printing.

SUMMARY OF THE INVENTION

Accordingly, it is the object of the present invention to provide a printing plate for waterless offset printing which has good image resolution, provides long print runs and has improved photosensitivity.

In accomplishing the foregoing objective, there has been provided, in accordance with one aspect of the present invention, a printing plate comprising (a) a support; (b) a photosensitive layer comprising (i) a diazonium salt polycondensation product; (ii) a free-radical polymerizable compound comprising at least one terminal ethylenically unsaturated group and having a boiling point, at atmospheric pressure, above 100° C.; and (iii) a polymerization initiator that forms free radicals under the action of actinic radiation; and (c) an overlying, printing-ink repellent silicone rubber layer, wherein the diazonium salt polycondensation product is preferably comprised of first recurring units ($A-N_2X$) and second recurring units (B) that are linked by bivalent intermediate members derived from a carbonyl compound which is capable of condensation. The first recurring units are derived from compounds represented by the formula $(R^1-R^3-)_p R^2-N_2X$, in which X denotes an anion of a diazonium compound, p denotes an integer from 1 to 3, $R^1$ denotes an aromatic radical having at least one position capable of condensation with an active carbonyl compound, $R^2$ denotes a phenylene group, $R^3$ denotes a single bond or one of the groups $-(CH_2)_q-NR^4-$, $-O-(CH_2)_r-NR^4-$, $-S-(CH_2)_r-NR^4-$, $-S-CH_2CO-NR^4-$, $-O-R^5-O-$, $-O-$, $-S-$ or $-CO-NR^4-$ q denoting an integer from 0 to 5, r denoting an integer from 2 to 5, $R^4$ denotes hydrogen, an alkyl group having 1 to 5 carbon atoms, an aralkyl group having 7 to 12 carbon atoms or an aryl group having 6 to 12 carbon atoms, and $R^5$ denotes an arylene group having 6 to 12 carbon atoms.

The second recurring units are preferably diazonium group-free units comprising radicals of an aromatic amine, a phenol, a phenol ether, an aromatic thioether, an aromatic hydrocarbon, an aromatic heterocyclic compound or an organic acid amide.

Other objects, features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

DETAILED DESCRIPTION OF PREFERRED EMBODIMENTS

The components of the photosensitive layer are essentially described in EP-A No. 0,167,963, (U.S. Pat. No. 4,659,645) and 0,211,391.

Suitable diazonium salt polycondensation products are products of the condensation of aromatic diazonium salts which are capable of condensation, for example diphenylamine-4-diazonium salts, with aldehydes, preferably formaldehyde. Co-condensation products which contain, in addition to the diazonium salt units, other, non-photosensitive units derived from compounds which are capable of condensation, in particular aromatic amines, phenols, phenol ethers, aromatic thioethers, aromatic hydrocarbons, aromatic heterocyclic compounds or organic acid amides, are used with particular advantage. These condensation products are described in DE-C No. 2,024,244. In general, all diazonium salt polycondensation products which are described in DE-A No. 2,739,774 are suitable.

Of the classes of compounds mentioned, the condensation product of diphenylamine - 4-diazonium salts which are optionally substituted by alkyl or alkoxy groups or by halogen atoms are preferred. As the second component B, preference is given to optionally substituted diphenyl ethers, diphenyl sulfides, diphenylmethanes or diphenyls. Specifically, bis-methoxymethyl, bis-hydroxymethyl or bis-acetoxymethyl derivatives of the parent structure are employed with particular advantage for the condensation. The condensation product can contain an average of 0.1 to 50, preferably 0.2 to 20, B units per A—$N_2X$ unit.

The proportion of the diazonium salt polycondensation product in the mixture is generally between 5 and 60, preferably between 10 and 40, % by weight, relative to the total content of nonvolatile components.

Further particularly advantageous polycondensation products are obtained by initially condensing an optionally substituted diphenylamine diazonium salt with an aromatic compound R'—O—$CH_2$—B and then with an aromatic compound R'—O—$CH_2$—B—$CH_2$—O—R', where R' is a hydrogen atom, an alkyl radical or an aliphatic acyl radical. These condensation products are described in EP-A No. 126,875.

As compounds which can be polymerized by means of free radicals, acrylates or methacrylates of polyhydric alcohols, in particular primary alcohols, are preferably employed. The alcohols may contain 2 to 6, preferably 2 to 4, OH groups. It is also possible for small amounts of (meth)acrylates of monohydric alcohols to be present in the mixtures. Examples of suitable esters are trimethylolpropane triacrylate, pentaerythritol triacrylate and tetraacrylate, propylene glycol monomethacrylate, glycerol dimethacrylate, triethylene glycol dimethacrylate, polyethylene glycol monoacrylate and monoacrylates or bisacrylates of oxyethylated bisphenol A derivatives. Preferred monomers are those which contain either a free OH group or an amino group. Examples are diethylene glycol monomethacrylate, glycerol monoacrylate and diacrylate and products of the reaction of triethanolamine and glycidyl methacrylate. Acrylates and methacrylates containing urethane groups are also suitable. The amount of polymerizable compounds is generally between 5 and 60, preferably 10 to 40, % by weight.

Photoinitiators which can be used are a large number of compounds, if appropriate also mixtures of two or more different compounds, frequently compounds with a synergistic action. Examples are benzoin and derivatives thereof, polynuclear quinones, acridine derivatives, for example 9-phenylacridine, 9-p-methoxyphenylacridine, and benz(a)acridine, phenazine derivatives, for example 9,10-dimethylbenz(a)-phenazine and 10-methoxybenz(a)phenazine; quinoxaline derivatives, for example 6,4',4''-trimethoxy-2,3-di-phenylquinoxaline and 4',4''-dimethoxy-2,3-diphenyl-5-azaquinoxaline; aromatically substituted bis-trichloromethyl-s-triazines, for example 2-naphth-1-yl-4,6-bis-trichloromethyl-, 2-acenaphthyl-4,6-bis-trichloromethyl-, 2-(4-ethoxyethoxynaphth-2-yl)-4,6-bis-trichloromethyl- and 2-(4-styrylphenyl)-4,6-bis-trichloromethyl-s-triazine, or trichloromethyl-substituted carbonylmethylene heterocyclic compounds, for example 2-(p-trichloromethylbenzoylmethylene)-3-ethylbenzothiazoline. The trichloromethyl compounds are particularly preferred. The amount of photoinitiator is generally between 0.05 and 10, preferably between 0.5 and 5, % by weight.

The photosensitive layer preferably also contains a polymeric binder. Suitable binders are, preferably, water insoluble polymers, such as epoxy resins, urea and melamine resins, ketone resins, vinyl acetate homopolymers and copolymers, poly(vinyl acetals), for example poly(vinyl formals) or poly(vinyl butyrals); polyurethanes, polyacrylates, polymethacrylates and cellulose esters. Of the polymers mentioned, the poly(vinyl acetals), in particular those which contain free vinyl alcohol and vinyl ester units, are preferred.

It is also possible to use binders which are insoluble in water, but soluble in aqueous alkaline solutions. Such binders are phenolic resins, polyvinylphenols, polysulfonylurethanes, copolymers of acrylic acid and methacrylic acid, styrene/maleic anhydride copolymers and products of the reaction of polymers containing OH groups, in particular polymers containing vinyl alcohol units, with anhydrides of polybasic carboxylic acids, in particular dicarboxylic acids or tricarboxylic acids. The last-mentioned polymers are particularly preferred. They are described in EP-A No. 0,152,819.

The products of the reaction with maleic anhydride, phthalic anhydride, succinic anhydride and 3-oxaglutaric anhydride are preferred.

Suitable synthetic polymers containing hydroxyl groups are, in particular, polymers containing vinyl alcohol units, but also epoxy resins and hydrolyzed epoxy resins, copolymers of allyl alcohol or higher unsaturated alcohols, polyhydroxyalkyl acrylates and methacrylates, and similar polymers.

In order to stabilize the photosensitive layer, it is advantageous to add a compound having an acid character to the layer. Mineral acids and strong organic acids are suitable, of which phosphoric acid, sulfuric acid, perchloric acid, boric acid and p-toluenesulfonic acid are preferred. A particularly highly suitable acid is phosphoric acid.

The photosensitive mixtures may furthermore contain dyes and/or pigments which can act as contrasting agents. Suitable dyes are indicated, for example, in U.S. Pat. Nos. 3,218,167 and 3,884,693. Further suitable dyes include, Victoria Pure Blue FGA, Renol Blue B2G-H (C.I. 74160), Crystal Violet or Rhodamine 6 GDN (C.I. 45160). In order to increase the image contrast after exposure, Metanil Yellow (C.I. 13065), Methyl Orange (C.I. 13025) or phenylazodiphenylamine can be used.

The thickness of the photosensitive layer is generally 0.2 to 5, preferably 0.5 to 3, $\mu$m.

The silicone caoutchouc layer is then applied to the photosensitive layer. It is applied from a solution in a nonpolar solvent, for example aliphatic or aromatic hydrocarbons, in which the components of the photosensitive layer are virtually insoluble under the coating conditions. Suitable silicone caoutchoucs are described in EP-A No. 0,226,201.

In principle, any silicone caoutchouc which is sufficiently ink-repellent is suitable for permitting offset printing without fountain solutions. For the purposes of this invention, "silicone caoutchouc" is, corresponding to the definition by Noll in "Chemie und Technologie der Silikone" [Chemistry and Technology of the Silicones], Verlag Chemie, 1968, p. 332, taken to mean a high-molecular-weight, essentially linear diorganopolysiloxane, whereas the term "silicone rubber" is used for the crosslinked or vulcanized products. In each case, a silicone caoutchouc solution is applied to the photosensitive layer, dried and then crosslinked.

Suitable silicone caoutchoucs are single-component and multicomponent types, as described, for example, in DE-A Nos. 2,350,211, 2,357,871 and 2,359,102.

The single-component silicone caoutchoucs are based on polysiloxanes which contain, for example, terminal acetyl, oxime, alkoxy or amino groups or hydrogen atoms. In addition, the polysiloxane essentially comprises a dimethylpolysiloxane chain. A small number of methyl groups may also be replaced by other alkyl groups, by haloalkyl groups or by substituted or unsubstituted aryl groups. The terminal functional groups are easily hydrolyzed and cure under the action of moisture within a time extending from a few minutes to hours.

The multicomponent silicone caoutchoucs may be crosslinked by addition or condensation. The addition-crosslinkable types generally contain polysiloxanes having alkenyl groups as substituents and those containing silicon-bound hydrogen atoms. They are crosslinked in the presence of platinum catalysts at temperatures above 50° C. They have the advantage that they crosslink rapidly at elevated temperature, for example around 100° C. On the other hand, the processing duration (pot time) of these systems may be relatively short.

The condensation-crosslinkable mixtures contain diorganopolysiloxanes having reactive terminal groups, for example OH and acetoxy groups. These are crosslinked with reactive silanes or oligosiloxanes in the presence of catalysts. These combinations also react relatively rapidly and therefore have a limited pot time.

Addition-crosslinkable multicomponent silicone caoutchoucs, as described, for example, in DE-A No. 2,654,893, are particularly advantageously employed.

These preferred silicone caoutchoucs are addition-crosslinkable multicomponent silicone caoutchoucs comprising (a) diorganopolysiloxanes containing terminal Si-vinyl groups; (b) organopolysiloxanes containing at least three silicon-bound hydrogen atoms; (c) platinum complexes of vinylsiloxanes and (d) an agent which delays the addition reaction of silicon-bound hydrogen atoms with aliphatic multiple bonds at room temperature.

After application as a layer, the silicone caoutchoucs are crosslinked in a known manner by means of the action of moisture or of their own accord at room temperature or elevated temperature to form a silicone rubber which is essentially insoluble in organic solvents. The finished silicone rubber layer generally has a thickness of from 1 to 20, preferably 2 to 10, μm. As stated above, coating is generally effected from non-polar solvents, for example paraffin hydrocarbons, in which the underlying photosensitive layer is sparingly soluble or insoluble.

Layers of the diazonium salt condensation products mentioned and the above-described ethylenically unsaturated polymerizable compounds in combination with covering layers of the preferred, particularly resistant and ink-repellent multicomponent silicone caoutchoucs can be developed easily and cleanly using organic solvents, if appropriate also with addition of water.

The printing plates according to the invention containing photosensitive layers of diazonium salt polycondensation products and photopolymerizable mixtures of polymerizable compounds and photoinitiators surprisingly have a higher photosensitivity than printing plates which contain layers comprising only one of these photocurable systems. The reasons for the higher practical photosensitivity achieved as a result here are not known in detail, but it is assumed that the adhesion of the exposed photosensitive layer to the silicone rubber layer is of essential importance for this. The photosensitivity in practice of printing plates of this type should therefore not be correlated with the photosensitivity of plates which contain only the corresponding photosensitive layer, but no silicone layer.

A further advantage for waterless offset printing of the printing plates according to the invention can be seen in the fact that, in contrast to known printing plates containing pure photopolymerizable layers, no oxygen barrier in the form of an additional covering layer or covering film is necessary.

The supports used are usually metals. The following can be employed for offset printing plates: mill-finished mechanically or electrochemically roughened and optionally anodized aluminum, which may additionally be pre-treated by chemical means, for example using polyvinylphosphonic acid, silicates, phosphates, hexafluorozirconates or hydrolyzed tetraethyl orthosilicates. Further suitable metals are steel and chromium. Since, in contrast to customary planographic printing plates, it is not necessary for the support surface to be hydrophilic, copper, brass or other oleophilic metals can also be used with advantage as the support surface. It is likewise possible to use plastic films, such as polyester, polycarbonate, polyimide or alternatively cellulose acetate films, whose surface may optionally be pre-treated in order to increase the wettability by printing inks. Rubber-elastic support materials are also suitable; using supports of this type, direct planographic printing is also possible.

The support material in the printing plates produced from the material according to the invention, in contrast to otherwise customary printing plates, functions as an ink-receptive material. The silicone rubber layer remaining after exposure and development functions as the image background and has an ink-repellent effect in the dry state. For printing, either customary oil-based printing inks or special hydrophilic printing inks can be used here, as have been developed for waterless offset printing and for reverse offset printing and are commercially available. Since most common support surfaces, for example roughened or anodically oxidized aluminum, are highly hydrophilic, hydrophilic printing inks are advantageously employed.

To develop the exposed printing plates, mixtures of organic solvents with one another or with water are preferably used. Specifically, a component which is capable of swelling the silicone rubber layer and a component which selectively dissolves the unexposed photosensitive layer are selected. Examples of suitable developers are combinations of paraffin hydrocarbons with polar solvents, such as esters, ketones or alcohols. Combinations of water-miscible solvents, such as lower alcohols or ketones, and water are also suitable.

Examples of preferred embodiments of the invention are described below. Unless otherwise stated, amounts and percentages relate to the weight. Before the working examples, the monomers used and the silicone caoutchouc solution used are described. The amounts are generally given in parts by weight (pbw).

Monomers Used

1. N-Methyldiethanolamine dimethacrylate
2. Triethanolamine trimethacrylate
3. Product of the reaction of 1 mole of triethanolamine and 3 moles of glycidyl methacrylate
4. Product of the reaction of 1 mole of triethanolamine and 3 moles of tolylene diisocyanate, further reacted with 3 moles of glycerol-1,3-dimethacrylate
5. Diethylene glycol monomethacrylate
6. Glycerol-1,3-dimethacrylate
7. Hydroxyethyl methacrylate
8. Glycerol monomethacrylate
9. Trimethylolpropane trimethacrylate Silicone Caoutchouc Solution Used 10 pbw of a dimethylpolysiloxane containing terminal vinyldimethylsiloxane units and having a viscosity of 7000 mPa.s at 25° C. were mixed with 0.025 pbw of 2-methyl-3-butyn-2-ol, 0.03 pbw of the mixture described below of a platinum complex of vinylsiloxane and a diluent, 0.09 pbw of a copolymer of 4 mol-% of trimethylsiloxane, 72 mol-% of methylhydrogensiloxane and 24 mol-% of dimethylsiloxane units having a viscosity of 50 mPa.s at 25° C. and a content of 1.36% of Si-bound hydrogen and 88.9 pbw of an isoparaffin mixture having a boiling range of 116°–136° C. at atmospheric pressure (Isopar E). The mixture can be processed for up to 24 hours after preparation.

The platinum complex mixture was prepared as follows: 20 pbw of sodium hydrogen carbonate were added to a mixture of 10 pbw of $H_2PtCl_6 \times 6H_2O$, 20 pbw of 1,3-divinyl-1,1,3,3-tetramethyldisiloxane and 50 pbw of ethanol. The mixture was refluxed for 30 minutes while stirring, then left to stand for 15 hours and then filtered. The volatile components were removed from the filtrate by distillation at 16 mbar. The residue obtained comprised 17 pbw of a liquid; this was dissolved in benzene, the solution was filtered, and the benzene was removed from the filtrate by distillation. The residue was mixed with a dimethylpolysiloxane which contained terminal vinyldimethylsiloxane units and had a viscosity of 1.4 Pa.s at 23° C., as a diluent in an amount such that the mixture contained 1% by weight of platinum, calculated as the element.

EXAMPLE 1

Comparative Example

A solution of
2.34 pbw of the diazonium salt condensation product of 1 mole of 3-methoxydiphenylamine 4-diazonium salt and 1 mole of 4,4'-bis-methoxymethyldiphenyl ether, isolated as mesitylene sulfonate,
1.56 pbw of product of the reaction of 50 pbw of a poly-vinyl butyral having a molecular weight of 70,000 to 80,000 and containing 71% of vinyl butyral, 2% of vinyl acetate and 27% of vinyl alcohol units, with 4 pbw of maleic anhydride,
0.069 pbw of $H_3PO_4$ (85% strength) and
0.019 pbw of phenylazodiphenylamine in
96.012 pbw of 2-methoxyethanol was applied to an electrolytically roughened and anodically oxidized aluminum plate and dried for 2 minutes at 100° C. The layer weight was 1 g/m². A covering layer of the above-mentioned silicone caoutchouc solution was applied to the plate and crosslinked by drying for 3 minutes at 110° C. The silicone rubber layer had a layer weight of 2.7–2.8 g/m2.

EXAMPLE 2

Comparative Example

The diazonium salt condensation product was replaced by the same amount by weight of the monomer 8. In addition, 0.21 pbw of 2-(4-ethoxynaphth-1-yl)-4,6-bis-trichloromethyl-s-triazine were added. Otherwise, the procedure was as in Example 1.

EXAMPLE 3

Comparative Example

The procedure was as in Example 2, but the monomer 8 was replaced by the monomer 6.

EXAMPLES 4 to 11

Coating solutions were prepared as in Example 1, but, in each case, 0.78 pbw of the total amount of the diazonium salt condensation product was replaced by the same amount of the monomers indicated in the table, and 0.07 pbw of the triazine compound indicated in Example 2 was added.

| Example No. | Monomer No. | Layer weight |
| --- | --- | --- |
| 4 | 1 | 1.0 |
| 5 | 2 | 1.3 |
| 6 | 3 | 1.0 |
| 7 | 4 | 1.1 |
| 8 | 5 | 1.0 |
| 9 | 6 | 1.1 |
| 10 | 7 | 1.0 |
| 11 | 8 | 1.0 |

The procedure was otherwise as in Example 1.

The plates thus produced were exposed under a mask for 30, 50, 70 and 90 seconds using a metal halide lamp (5 kW). The mask used was a continuous-tone step wedge having 12 density steps of 0.15 each, beginning with density 0.15 in step 1.

The exposed plates were treated for 6 minutes in a developer solution using an oscillation felt (stroke 4.8 mm, oscillation frequency 3000/min, pressure 500N/m²). The developer solution had the following composition:
40 pbw of a mixture of isoparaffins having the boiling range 176°–188° C.,
2 pbw of tripropylene glycol and
30 pbw of diethylene glycol dimethyl ether.

The plates were rinsed with water and inked with printing ink. The result is shown in the table below. It shows the number of steps not attacked during development.

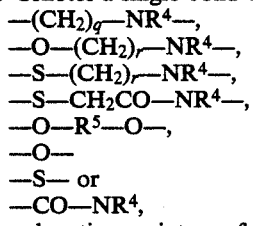

| Example No. | Monomer No. | Exposure time (seconds) | | | |
|---|---|---|---|---|---|
| | | 30 | 50 | 70 | 90 |
| 1 (c) | — | | 2–3 | 3–4 | 4–5 | 5 |
| 2 (c) | 8 | | | | <1 |
| 3 (c) | 6 | | | | <1 |
| 4 | 1 | 5 | 6 | 7 | 7–8 |
| 5 | 2 | 4 | 5 | 6 | 6–7 |
| 6 | 3 | 3–4 | 5 | 5–6 | 6–7 |
| 7 | 4 | 3 | 4 | 5 | 6 |
| 8 | 5 | 3 | 4–5 | 5–6 | 6 |
| 9 | 6 | 3 | 4 | 5 | 6 |
| 10 | 7 | 3 | 4–5 | 5–6 | 6 |
| 11 | 8 | 3 | 4–5 | 5–6 | 6 |

What is claimed is:

1. A photosensitive printing plate for waterless offset printing comprising:
   (a) a support;
   (b) a photosensitive layer comprising in admixture:
      (i) a photosensitive diazonium salt polycondensation product comprising first recurring units and second recurring units that are linked by bivalent intermediate members derived from a carbonyl compound which is capable of condensation, said first recurring units being derived from aromatic diazonium salts which are capable of condensing with formaldehyde, and said second recurring units being derived from diazonium group-free compounds which are capable of condensing with formaldehyde, in an amount sufficient to substantially decrease the layer solubility on exposure to actinic radiation;
      (ii) a free-radical polymerizable acrylate or methacrylate of a polyhydric alcohol in an amount sufficient to form a polymerized product which decreases the solubility of said layer in combination with said photosensitive diazonium salt polycondensation product on exposure to actinic radiation;
      (iii) a polymerization initiator that forms free radicals under the action of actinic radiation in an amount sufficient to initiate polymerization of said polymerizable compound on exposure to said radiation; and
      (iv) a polymeric binder in an amount sufficient to improve the resistance of the exposed layer against printing wear; and
   (c) an overlying, printing-ink repellant silicone rubber layer.

2. A photosensitive printing plate as claimed in claim 1, wherein said bivalent intermediate members comprise methylene groups.

3. A photosensitive printing plate as claimed in claim 1, wherein said second recurring units comprise radicals of an aromatic amine, a phenol, a phenol ether, an aromatic thioether, an aromatic hydrocarbon, an aromatic heterocyclic compound or an organic acid amide.

4. A photosensitive printing plate as claimed in claim 1, wherein said first recurring units are derived from compounds represented by the formula $(R^1-R^3-)_p-R^2-N_2X$, in which
   X denotes an anion of a diazonium compound,
   p denotes an integer from 1 to 3,
   $R^1$ denotes an aromatic radical having at least one position which is capable of condensation with an active carbonyl compound,
   $R^2$ denotes a phenylene group,
   $R^3$ denotes a single bond or one of the groups:
   $-(CH_2)_q-NR^4-$,
   $-O-(CH_2)_r-NR^4-$,
   $-S-(CH_2)_r-NR^4-$,
   $-S-CH_2CO-NR^4-$,
   $-O-R^5-O-$,
   $-O-$
   $-S-$ or
   $-CO-NR^4$,
   q denoting an integer from 0 to 5,
   r denoting an integer from 2 to 5,
   $R^4$ denotes hydrogen, an alkyl group having 1 to 5 carbon atoms, an aralkyl group having 7 to 12 carbon atoms or an aryl group having 6 to 12 carbon atoms, and
   $R^5$ denotes an arylene group having 6 to 12 carbon atoms.

5. A photosensitive printing plate as claimed in claim 1, wherein said polymerizable compound contains at least one free hydroxyl group or at least one amino group.

6. A photosensitive printing plate as claimed in claim 1, wherein said polymeric binder is a water-insoluble polymer.

7. A photosensitive printing plate as claimed in claim 1, wherein said polymeric binder is insoluble in water but soluble in aqueous alkaline solutions.

8. A photosensitive printing plate as claimed in claim 1, wherein said binder comprises a product of the reaction of an intramolecular anhydride of an organic polycarboxylic acid with a synthetic polymer which comprises hydroxyl groups, but no other functional groups which are capable of reacting with acid anhydrides.

9. A photosensitive printing plate as claimed in claim 1, wherein said photosensitive layer comprises about 10 to 90% by weight of diazonium salt polycondensation product and about 5 to 60% by weight of polymerizable compound.

10. A photosensitive printing plate as claimed in claim 1, wherein said silicone rubber layer comprises a crosslinked addition-type multicomponent caoutchouc.

11. A photosensitive printing plate as claimed in claim 1, wherein said photosensitive layer has a thickness of from about 0.2 to 5 $\mu$m and said silicone rubber layer has a thickness of from about 1 to 20 $\mu$m.

12. A photosensitive printing plate as claimed in claim 1, wherein said photosensitive layer further comprises a dye.

13. A photosensitive printing plate as claimed in claim 1, wherein said support has a surface comprising aluminum, chromium, or steel.

14. A photosensitive printing plate as claimed in claim 1, wherein said support has a surface comprising an oleophilic metal.

15. A photosensitive printing plate as claimed in claim 14, wherein said oleophilic metal comprises copper or brass.

16. A photosensitive printing plate as claimed in claim 1, wherein said support comprises a plastic film.

* * * * *